(12) United States Patent
Binnard et al.

(10) Patent No.: US 6,570,644 B2  
(45) Date of Patent: May 27, 2003

(54) CONNECTION ASSEMBLY OF WAFER STAGE CHAMBER

(75) Inventors: Michael Binnard, Belmont, CA (US); Michael Kovalerchik, Castro Valley, CA (US)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 09/873,329

(22) Filed: Jun. 5, 2001

(65) Prior Publication Data

US 2002/0180945 A1 Dec. 5, 2002

(51) Int. Cl.⁷ .................. G03B 27/58; G03B 27/42; G03B 27/62
(52) U.S. Cl. .............. 355/72; 355/53; 355/75
(58) Field of Search .............. 355/30, 53, 72–76; 310/10, 12; 378/34; 318/649; 414/217

(56) References Cited

U.S. PATENT DOCUMENTS

| 4,833,899 A | * 5/1989 | Tugal | 62/55.5 |
| 4,989,031 A | * 1/1991 | Kamiya | 355/30 |
| 5,746,562 A | * 5/1998 | Hasegawa et al. | 4414/217 |
| 5,982,128 A | 11/1999 | Lee | 318/568.16 |
| 6,246,204 B1 | 6/2001 | Ebihara et al. | 318/649 |

* cited by examiner

Primary Examiner—Henry Hung Nguyen  
(74) Attorney, Agent, or Firm—Finnegan, Henderson, Farabow, Garrett & Dunner, LLP

(57) ABSTRACT

A connection assembly is provided to connect a part positioned inside a chamber assembly to a stationary surface. The chamber assembly provides a controlled atmospheric condition therein to isolate semiconductor substrates, a wafer stage device, and the process of making semiconductor substrates from the atmospheric condition so that the resulted substrates have an improved quality and meet certain wafer manufacturing specifications. The connection assembly includes a vibration isolation connection assembly and a bellows assembly. The vibration isolation connection assembly is removably connected to a part positioned in the chamber assembly via a link. The bellows assembly encases the vibration isolation connection assembly to maintain a controlled condition of the chamber assembly. The bellows assembly has a first end removably connected to a panel of the chamber assembly, and a second end connected to a stationary surface. The bellows assembly is compressible exposing the vibration isolation connection assembly when fastening or loosening the vibration isolation connection assembly.

11 Claims, 14 Drawing Sheets

CONNECTION ASSEMBLY OF WAFER STAGE CHAMBER

FIELD OF THE INVENTION

This invention relates to a connection assembly for connecting a chamber assembly of a wafer manufacturing system to a stationary surface. More particularly, this invention relates to a connection assembly for connecting a part of a stage assembly positioned inside the chamber assembly, which provides a controlled atmospheric condition therein, from the external atmospheric condition. The chamber assembly may be a part of a projection exposure apparatus for use in a photolithography process to manufacture semiconductor substrates.

DESCRIPTION OF THE RELATED ART

In manufacturing integrated circuits using a photolithography process, light is transmitted through non-opaque portions of a pattern on a reticle, or photomask, through a projection exposure apparatus, and onto a wafer of specially-coated silicon or other semiconductor material. The uncovered portions of the coating, that are exposed to light, are cured. The uncured portions of the coating are removed by an acid bath. Then, the layer of uncovered silicon is altered to produce one layer of the multi-layered integrated circuit. Conventional systems use visible and ultraviolet light for this process. Recently, however, visible and ultraviolet light have been replaced with electron, x-ray, and laser beams, which permit smaller and more intricate patterns.

As the miniaturization of a circuit pattern progresses, the focus depth of the projection exposure apparatus becomes very small, making it difficult to align accurately the overlay of circuit patterns of the multi-layered integrated circuit. As a result, a primary consideration for an overall design of the photolithography system includes building components of the system that achieve precision by maintaining small tolerances. Any vibration, distortion, or misalignment caused by internal, external or environmental disturbances must be kept at minimum. When these disturbances affect an individual part, the focusing properties of the photolithography system are collectively altered.

In a conventional exposure apparatus of a photolithography system to manufacture semiconductor wafers, a wafer stage assembly is used in combination with a projection lens assembly. The wafer stage assembly includes a wafer table to support the wafer substrates, a wafer stage to position the wafer substrates on the wafer table as the wafer stage is being accelerated by a force generated in response to a wafer manufacturing control system, and a wafer stage base to support the wafer stage. The wafer manufacturing control system is a central computerized control system.

The exposure apparatus generally includes an apparatus frame that rigidly supports the wafer stage assembly, the projection lens assembly, a reticle stage assembly, and an illumination system. In operation, the exposure apparatus transfers a pattern of an integrated circuit from a reticle onto the wafer substrates. To permit smaller and more intricate circuit pattern, the projection lens assembly must accurately focus the energy beam on a targeted exposure point of the wafer substrate to align the overlay of circuit patterns of the multi-layered integrated circuit. The exposure apparatus can be mounted to a base, such as the ground or via a vibration isolation system.

There are several different types of photolithography devices, including, for example, a scanning type and a step-and-repeat type. In the scanning type photolithography system, the illumination system exposes the pattern from the reticle onto the wafer with the reticle and the wafer moving synchronously. The reticle stage moves the reticle in a plane generally perpendicular to the optical axis of the lens assembly, while the wafer stage moves the wafer in another plane generally perpendicular to the optical axis of the lens assembly. Scanning of the reticle and wafer occurs while the reticle and wafer are moving synchronously.

Alternatively, in the step-and-repeat type photolithography system, the illumination system exposes the reticle while the reticle and the wafer are stationary. The wafer is in a constant position relative to the reticle and the lens assembly during the exposure of an individual field. Between consecutive exposure steps, the wafer is moved by the wafer stage perpendicular to the optical axis of the lens assembly so that the next field of the wafer is brought into position relative to the lens assembly and the reticle for exposure. Using this process, the images on the reticle are sequentially exposed onto the fields of the wafer.

In most types of photolithography systems, the photolithography process of the conventional exposure apparatus is performed with the semiconductor substrates exposed to the atmosphere.

Recent developments, enabling the photolithography process to meet certain wafer manufacturing specifications and to improve the quality of the resulting wafers, require that the semiconductor substrates be processed in a controlled atmosphere, such as nitrogen or helium. To take advantage of the recent developments, a wafer stage chamber assembly has been proposed that isolates the semiconductor substrates, the wafer stage device, and the manufacturing process thereof from the atmosphere. The wafer stage chamber assembly is discussed in further detail in U.S. patent application Ser. No. 09/759,218 (attorney reference no. 7303.0034, PAO 358-US), filed on Jan. 16, 2001 the entire disclosure of which is incorporated by reference.

Occasionally, the wafer stage chamber assembly needs to be disassembled by removing a part or parts from the exposure apparatus for servicing purposes, periodic maintenance, or other reasons. Since some parts of the wafer stage assembly in the chamber assembly are connected to a stationary surface, such as the ground, there is a need for a quick way to disconnect the parts from the stationary surface. The present invention is directed to a connection assembly for connecting the parts inside the wafer stage chamber assembly to a stationary surface, the connection assembly being capable of maintaining the controlled condition inside the wafer stage chamber assembly while allowing a quick way to disconnect the parts when the chamber assembly needs to be removed for maintenance or servicing.

SUMMARY OF THE INVENTION

The advantages and purposes of the invention will be set forth in part in the description which follows, and in part will be obvious from the description, or may be learned by practice of the invention. The advantages and purposes of the invention will be realized and attained by the elements and combinations particularly pointed out in the appended claims.

To attain the advantages and consistent with the principles of the invention, as embodied and broadly described herein, a first aspect of the invention is a connection assembly of a chamber assembly, comprising a vibration isolation connection assembly and a bellows assembly. The vibration isolation connection assembly is removably connected to a part positioned in the chamber assembly via a link. The bellows assembly encases the vibration isolation connection assembly to maintain a controlled condition of the chamber assembly. The bellows assembly has a first end removably connected to a panel of the chamber assembly, and a second end removably connected to a stationary surface. The bellows assembly is compressible to expose the vibration isolation connection assembly.

A second aspect of the present invention is a vibration isolation connection assembly to connect a part in a chamber assembly to a stationary surface. The vibration isolation connection assembly comprises a shock absorbing assembly and a shock absorbing nut. The shock absorbing assembly has a first end for a removable first mating engagement with a link, and a second end removably connected to the stationary surface. The link connects the shock absorbing assembly to the part in the chamber assembly. The shock absorbing nut is positioned adjacent to the first end of the shock absorbing assembly to engage with the link.

A third aspect of the present invention is a bellows assembly to encase an assembly connecting a chamber assembly to a stationary surface. The chamber assembly provides a controlled atmospheric condition therein. The bellows assembly comprises a bellows cylinder having a first end removably connected to a panel of the chamber assembly, and a second end removably connected to the stationary surface. The bellows assembly also comprises a bellows attached to the bellows cylinder.

A fourth aspect of the present invention is a method for connecting a part in a chamber assembly to a stationary surface. The chamber assembly provides a controlled atmospheric condition therein. The method comprises connecting the part in the chamber assembly via a link to a vibration isolation connection assembly, and encasing the vibration isolation connection assembly to maintain the controlled atmospheric condition of the chamber assembly.

A fifth aspect of the present invention is a method for connecting a reaction frame in a chamber assembly to a stationary surface. The method comprises providing a bellows assembly to removably connect the chamber assembly to the stationary surface. The bellows assembly has a sealing engagement to maintain a controlled condition of the chamber assembly. The method also comprises providing a vibration isolation connection assembly to removably connect a frame positioned in the chamber assembly to a shock absorbing assembly.

It is to be understood that both the foregoing general description and the following detailed description are exemplary and explanatory only and are not restrictive of the invention as claimed. Additional advantages will be set forth in the description which follows, and in part will be understood from the description, or may be learned by practice of the invention. The advantages and purposes may be obtained by means of the combinations set forth in the attached claims.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings.

DESCRIPTION OF THE INVENTION

Reference will now be made in detail to an embodiment of the assembly and system consistent with the principles of the present invention, examples of which are illustrated in the accompanying drawings. The invention will be further clarified by the following examples, which are intended to be exemplary of the invention.

The assembly and system consistent with the principles of the present invention provide a quick way to connect and disconnect parts inside a wafer stage chamber assembly to and from a stationary surface while maintaining a controlled atmospheric condition inside the chamber assembly. The wafer stage chamber assembly isolates semiconductor substrates, the wafer stage device, and the process of making thereof from external atmospheric condition so that the resulting semiconductor wafers meet certain wafer manufacturing specifications and obtain the specified quality standards. The principles of this invention are similarly applicable to other parts of the photolithography system, such as a reticle stage device. Thus, this invention is not limited to any particular application. Rather, the assembly and system disclosed herein could be used in any system configured to embody similarly disclosed elements which require a chamber to isolate the sensitive and accurately aligned assembly or device therein.

Figure 1:
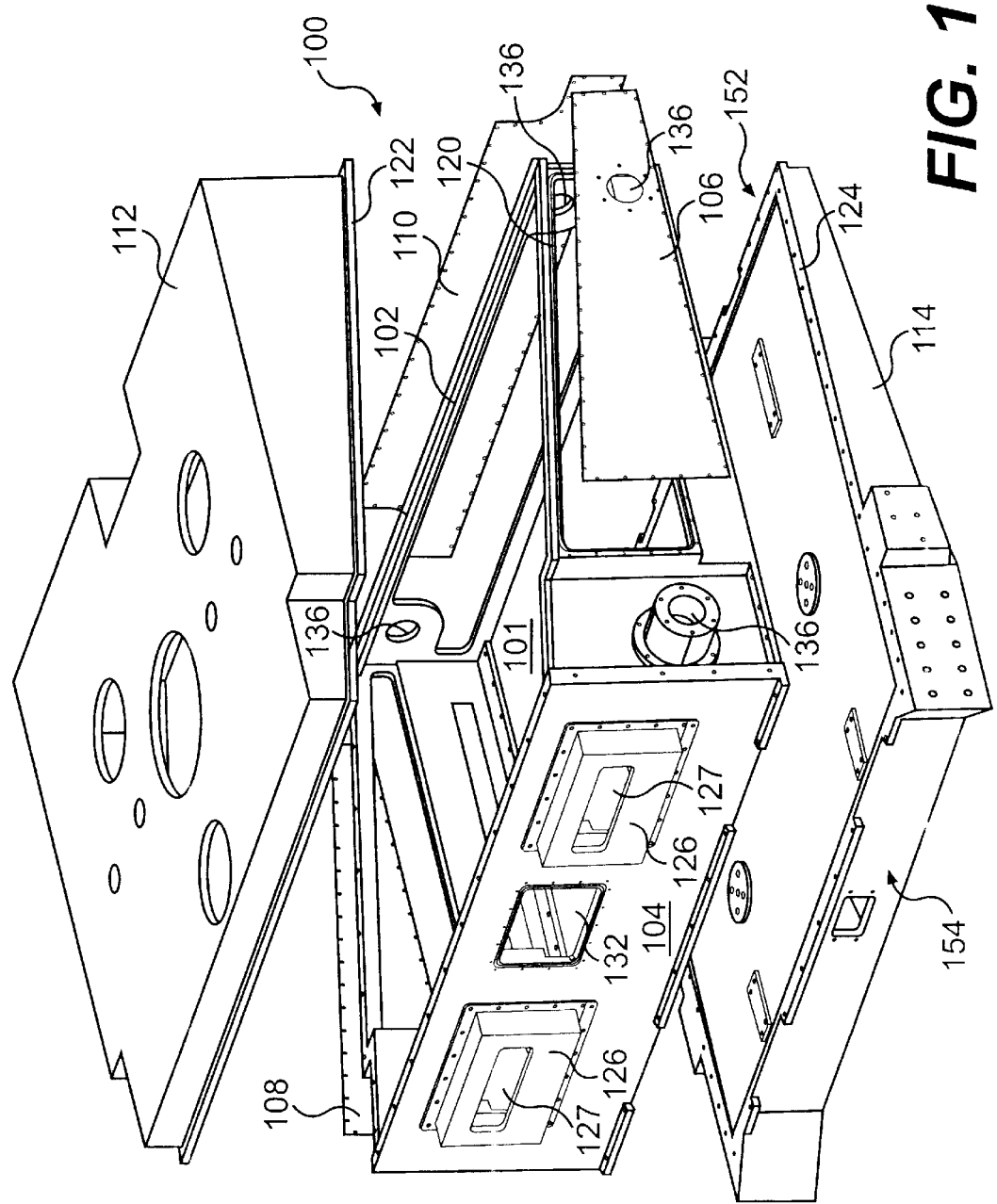
FIG. 1 is an exploded perspective frontal view of a wafer stage chamber assembly.

For purposes of understanding the present invention, a wafer stage chamber assembly will be discussed briefly. Such a wafer stage chamber assembly is described in detail in co-pending U.S. application Ser. No. 09/759,218, filed on Jan. 16, 2001, the entire disclosure of which is incorporated by reference. As illustrated in FIG. 1, a wafer stage chamber assembly 100 for use in manufacturing semiconductor substrates comprises a wafer stage chamber 101 constructed of a chamber frame 102 to enclose a wafer stage device 66 (shown in FIG. 2), and a plurality of chamber walls or panels 104, 106, 108, and 110 attached to chamber frame 102. Chamber frame 102 defines the shape of wafer stage chamber assembly 100, and may be made of steel plates and permanently fastened, such as by welding, to construct chamber frame 102. To isolate the interior of wafer stage chamber assembly 100 from the external atmospheric condition, vibration, and other disturbances, chamber frame 102 is provided with a plurality of grooves 120 around the border where each of the chamber panels 104, 106, 108, and 110 is to be attached for receiving a sealing material. Similarly, top wall 112 has a first sealing flange 122 around the border to seal the engagement between top wall 112 and chamber frame 102. Likewise, base frame 114 has a second sealing surface 124 around the border to seal the engagement between base frame 114 and chamber frame 102. The sealing material may be a commercially available o-ring seal.

Figure 2:
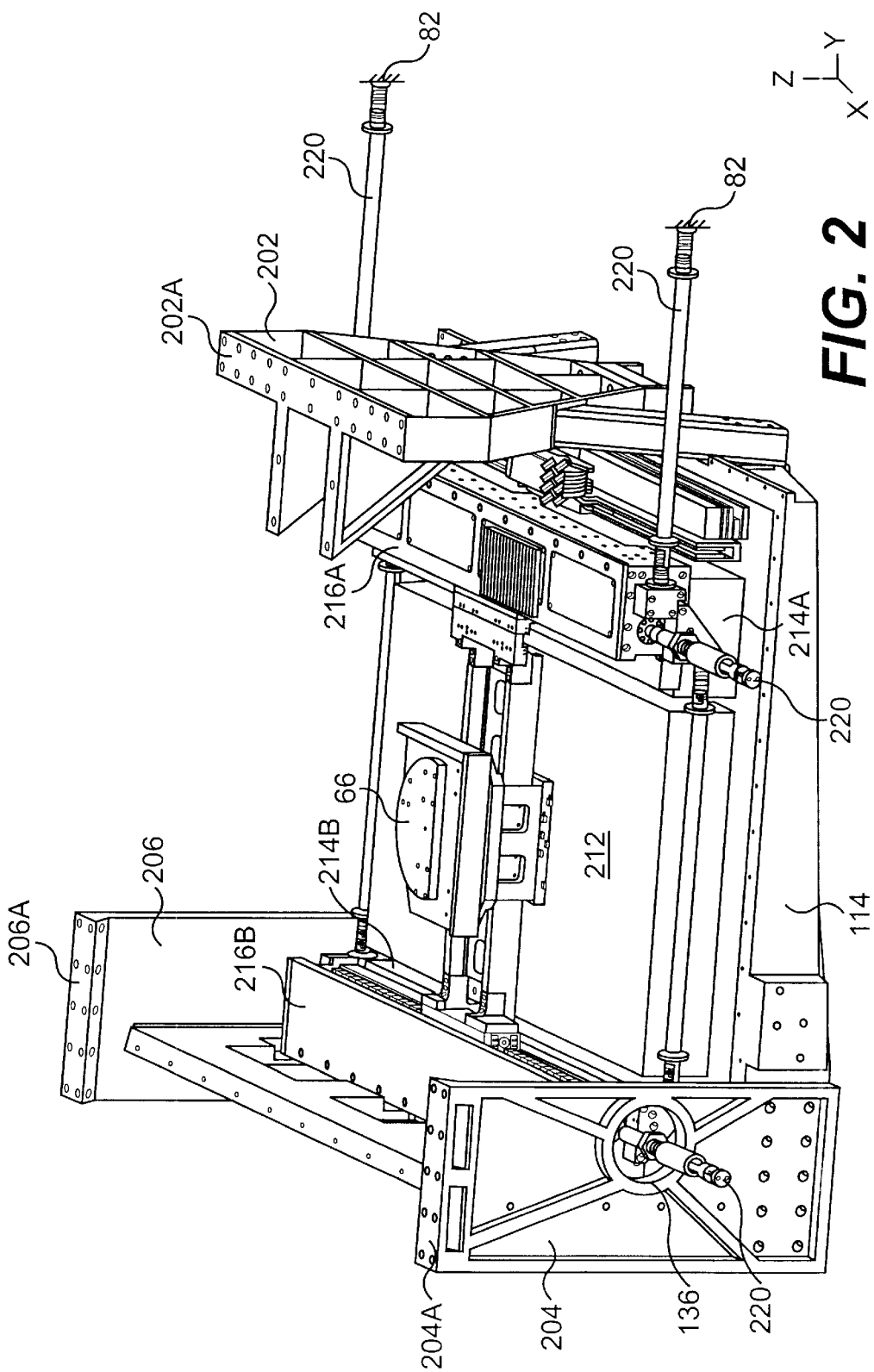
FIG. 2 is a perspective view of a base assembly for supporting the wafer stage chamber assembly of FIG. 1 and a wafer stage assembly.
Figure 3:
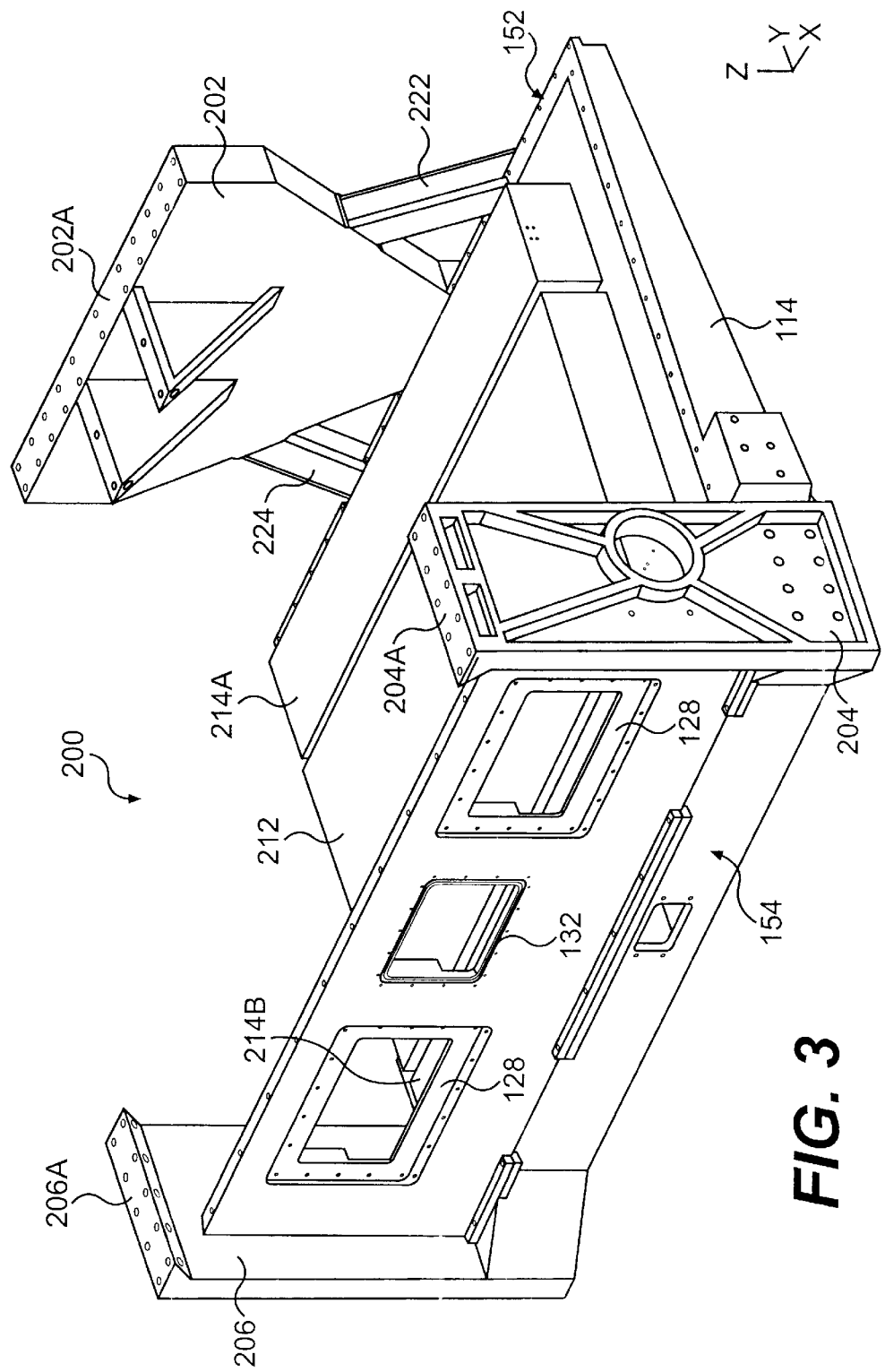
FIG. 3 is a perspective frontal view of a base assembly for supporting the wafer stage chamber assembly shown in FIG. 1 without the wafer stage assembly.
Figure 4:
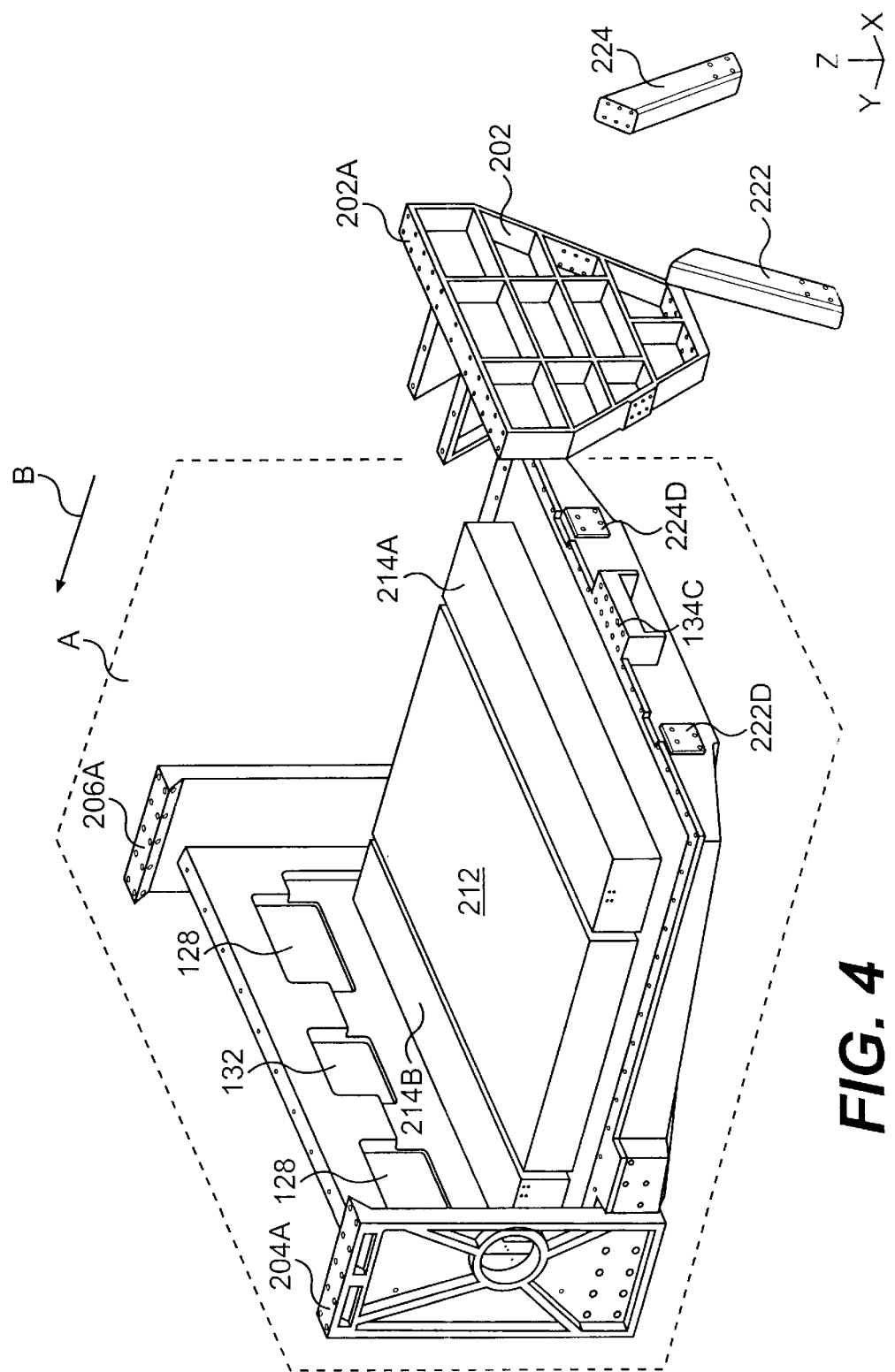
FIG. 4 is a semi-exploded perspective rear view of the base assembly illustrating reference area A when removed from an exposure apparatus.

The wafer stage chamber assembly is supported by a base assembly, which is described in detail in co-pending U.S. application Ser. No. 09/843,076, filed on Apr. 27, 2001, the entire disclosure of which is incorporated by reference. A base assembly 200 is illustrated in FIGS. 2–4 including the base frame 114, a stage base 212 and at least one mover base 214A, 214B. To minimize any disturbances and to achieve the required precision in a sensitive system, such as the exposure apparatus to manufacture semiconductor substrates, wafer stage 66 is provided on an air bearing support (not shown) so that wafer stage 66 levitates above stage base 212. An underside of wafer stage 66 is provided with a plurality of pneumatic channels (not shown) to generate the air bearing support. Wafer stage chamber assembly 100 and base frame 114 are supported by a plurality of body supports 202, 204, and 206. Body support 202 is provided on rear section 152, while body supports 204, 206 are on front section 154. Rear body support 202 may additionally be provided with a pair of support struts 222, 224.

Stage base 212 is provided between a pair of mover bases 214A and 214B. Stage base 212 supports wafer stage 66, and mover bases 214A, 214B support a pair of mover assemblies 216A, 216B, respectively. Mover assemblies 216A, 216B absorb reaction forces (not shown) generated by the movement of wafer stage 66, and thereby, stabilize the overall wafer stage chamber assembly 100. Mover assemblies 216A, 216B may be connected to stationary surfaces 82, such as the ground, or to a vibration isolating system (not shown) via a plurality of connection assemblies 220.

Occasionally, wafer stage chamber assembly 100 needs to be disassembled by removing a part from exposure apparatus 21 (shown in FIG. 12) for servicing purposes, periodic maintenance, or other reasons. A wafer stage carrier may be provided to facilitate the removal process. The wafer stage carrier is described in detail in co-pending U.S. application Ser. No. 09/843,077, filed Apr. 27, 2001, the entire disclosure of which is incorporated by reference. As shown in FIG. 4, to remove wafer stage chamber assembly 100, the procedure begins by loosening the fasteners (not shown) at support mounting surfaces 204A, 206A, 1340. Similarly, if rear body support 202 includes support struts 222, 224, the fasteners (also not shown) securing support struts 222 and 224 at strut mounting surfaces 222D and 224D, respectively, are loosened. The fasteners at mounting surface 202A connecting rear body support 202 to apparatus frame 72 remain secured. Thereafter, to remove wafer stage chamber assembly 100, the wafer stage chamber assembly 100, only base assembly 200 as illustrated and represented by reference area A, may slide out toward the front side of exposure apparatus 21 as indicated by arrow B.

The plurality of chamber panels include a front panel 104, a pair of side panels 106 and 108, and a rear panel 110. Front panel 104 is a shear panel having sufficient stiffness to strengthen chamber frame 102. For example, in one embodiment, front shear panel 104 is made of stainless steel having a thickness of approximately 20 mm. Front shear panel 104 has at least one loader port 126 (two are shown in FIG. 1). Each loader port 126 is provided with a loader window 127 to provide access for semiconductor substrates 68 (shown in FIG. 12) to go into and out of wafer chamber assembly 100. For each loader port 126, a corresponding loader opening 128 (best shown in FIGS. 3 and 4) is provided on front shear panel 104. Loader ports 126 are in a saling engagement with front shear panel 104 to maintain the controlled atmospheric condition inside wafer stage chamber assembly 100. A commercially available o-ring seal may be used.

In addition, front shear panel 104 may have a window 132, shown in FIG. 1 to be positioned between a pair of loader ports 126. Window 132 may be used to allow an operator to view wafer stage 66 and other parts inside wafer stage chamber assembly 100. Alternatively, window 132 may be used to connect an air conditioning duct (not shown). Additionally, window 132 is in a sealing engagement with front shear panel 104 to maintain the sealed condition inside wafer stage chamber assembly 100.

The chamber walls include a pair of side panels 106 and 108, and a rear panel 110. Each panel 106, 108, or 110 may be layered with an insulating material to isolate the sensitive and accurately aligned components inside wafer stage chamber assembly 100 from external temperature, noise, vibration, and other disturbances. The insulating material may be any types of conventional insulations, such as fiberglass. Side panels 106, 108, and rear panel 110 may be fastened to chamber frame 102 by way of welding, or bolting, or both. An o-ring seal may be provided around the perimeter of each panel 106, 108, or 110 to maintain the internal atmospheric purity of wafer stage chamber assembly 100.

One or more of panels 106, 108, and 110 may include an access opening for connecting an internal component of wafer stage chamber assembly 100 to an external component, structure, or stationary surface, such as the ground. In the illustrated embodiment, each of side panels 106, 108 and rear panel 110 may be provided with a pair of connection ports 136 for connecting component(s), such as mover assemblies 216A and 216B inside wafer stage chamber assembly 100, to the stationary surface 82, via a pair of connection assemblies consistent with the principles of the present invention. Thus, in the illustrated embodiment, mover assemblies 216A, 216B are stabilized by four connection assemblies of the present invention. The present invention anticipates other embodiments in which different numbers and configurations of the connection assemblies are used to connect and stabilize the part inside chamber assembly 100.

Consistent with the invention, a connection assembly includes a vibration isolation connection assembly and a bellows assembly. The vibration isolation connection assembly is removably connected to a part of a wafer stage assembly, such as a mover assembly, which is positioned in the stage chamber, via a link. The bellows assembly encases the vibration isolation connection assembly to maintain a controlled condition of the stage chamber. The bellows assembly has a first end removably connected to a panel of the stage chamber, and a second end removably connected to a stationary surface, the bellows assembly being compressible to expose the vibration isolation connection assembly.

Figure 5:
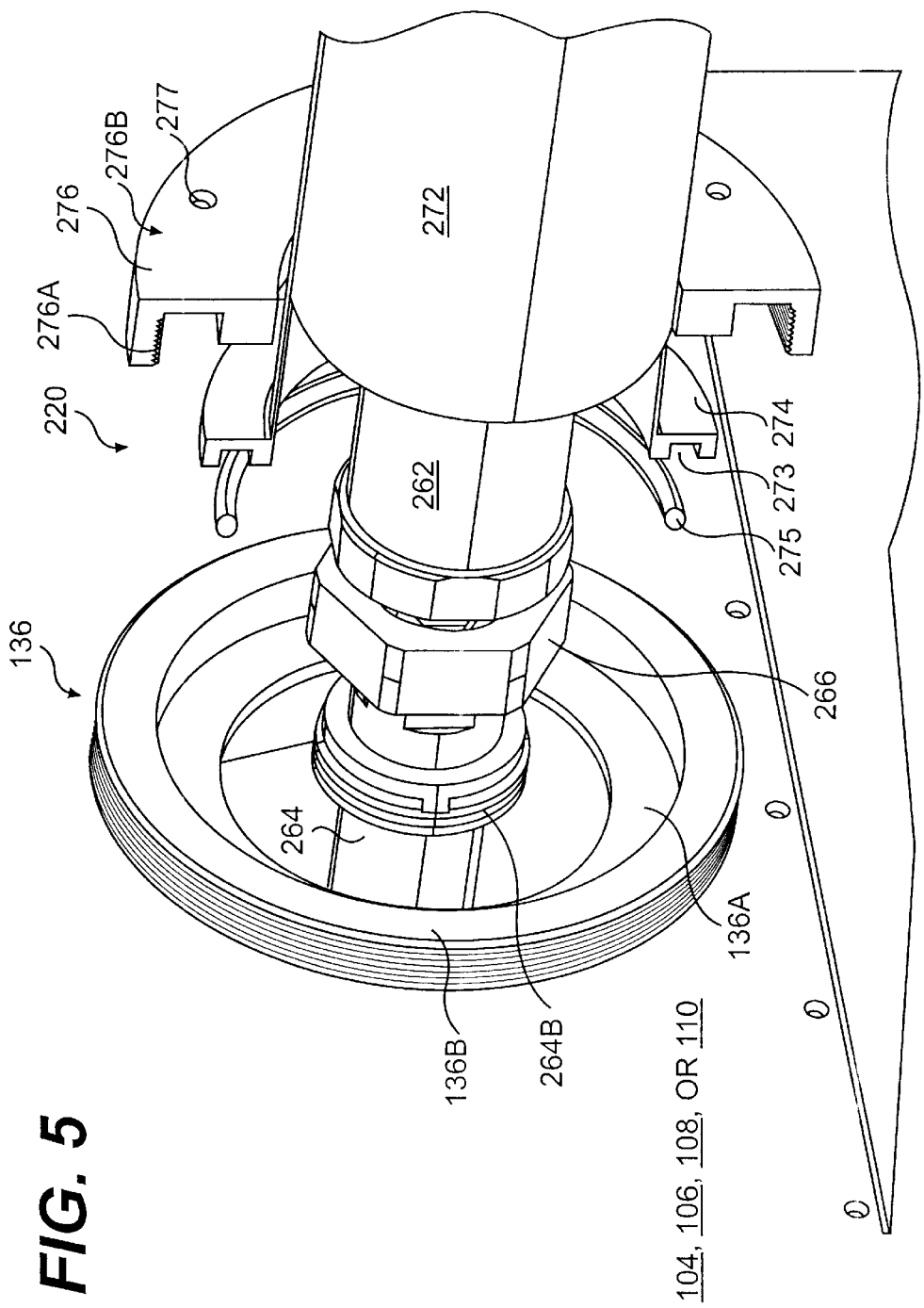
FIG. 5 is an enlarged fragmentary perspective view of a connection assembly consistent with the principles of the present invention, the connection assembly including a vibration isolation connection assembly encased by a bellows assembly, some parts being shown in sections.
Figure 6:
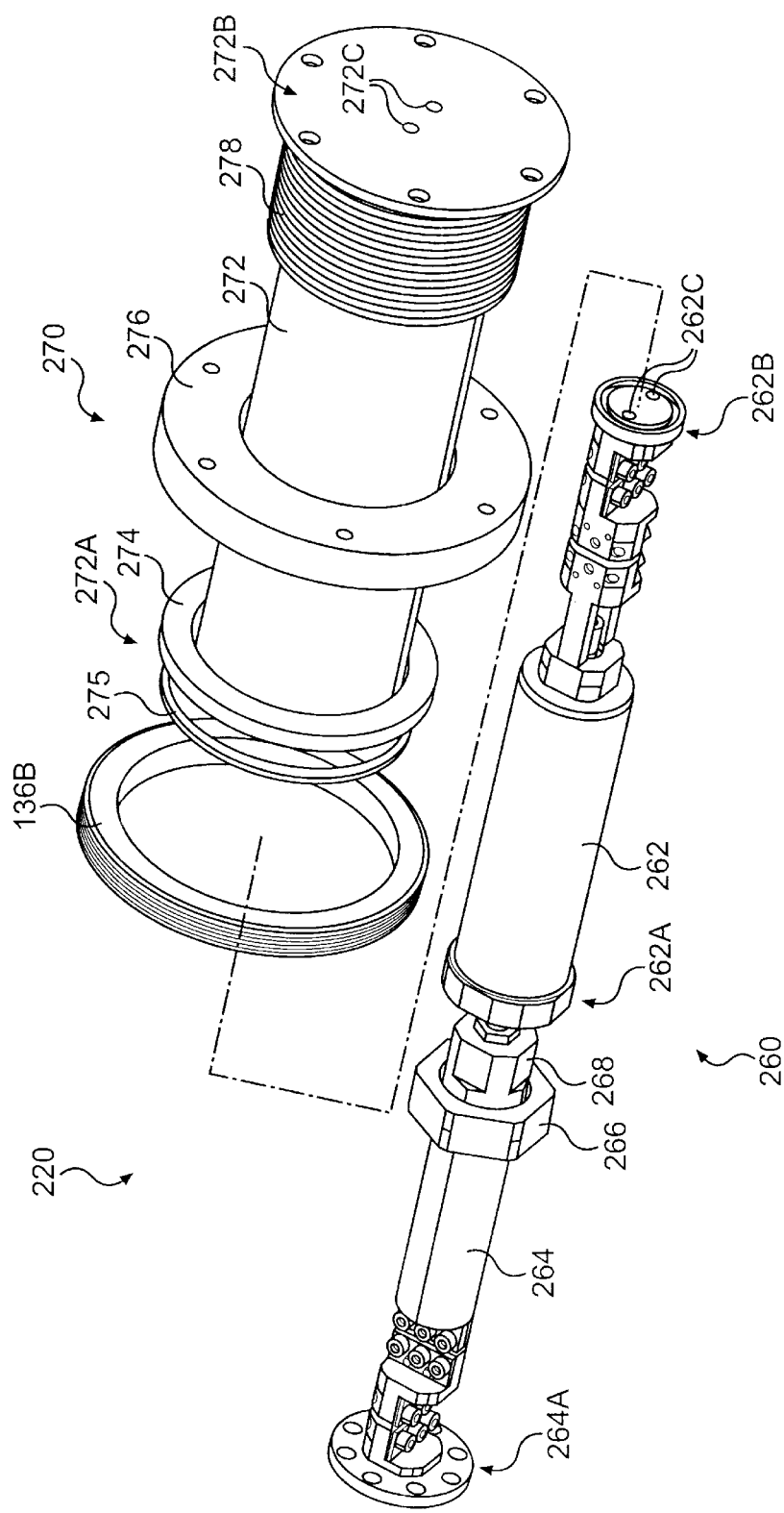
FIG. 6 is a perspective view of the connection assembly shown in FIG. 5 illustrating the vibration isolation connection assembly being separated from the bellows assembly, the vibration isolation connection assembly being in an assembled configuration to a reaction link.
Figure 7:
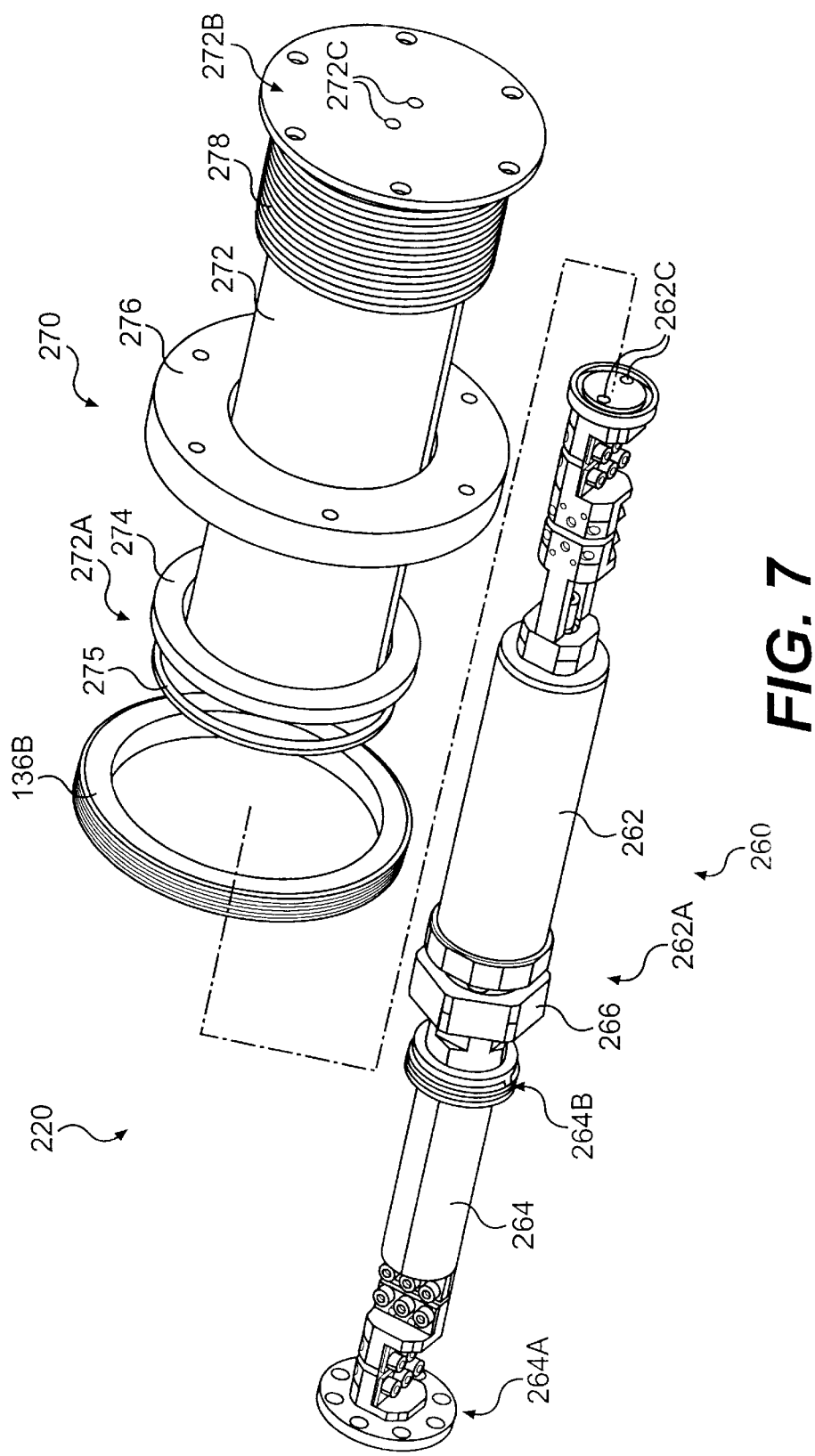
FIG. 7 is a perspective view of the vibration isolation connection assembly and the bellows assembly shown in FIG. 6, the vibration isolation connection assembly being in a disassembled configuration to the reaction link.

In the embodiment illustrated in FIGS. 5–7, connection assembly 220 is shown to include a vibration isolation connection assembly 260 and a bellows assembly 270. For purposes of this invention, a first end of an elongated body is defined to be the end adjacent to or facing toward wafer stage chamber assembly 100, while the second end is the end adjacent to or facing toward stationary surface 82. Vibration isolation connection assembly 260 comprises a shock absorbing assembly 262, an elongated body having a first end 262A for a mating engagement with a reaction link 264, and a second end 262B removably connected to bellow assembly 270.

FIG. 6 illustrates an assembled configuration of vibration isolation connection assembly 260 to reaction link 264. Reaction link 264 has a first end 264A for anchoring reaction link 262 to a mover assembly 216A or 216B positioned inside wafer stage chamber assembly 100. FIG. 7 illustrates vibration isolation connection assembly 260 being disassembled from reaction link 264. Reaction link 264 is shown to have a second end 264B, preferably threaded to receive a shock absorbing nut 266. Shock absorbing nut 266 is positioned adjacent first end 262A of shock absorbing assembly 262.

Also consistent with the principles of the present invention, bellows assembly 270 comprises an elongated bellows cylinder 272, a sealing flange 274, a bellows nut 276, and a bellows 278. In the embodiment illustrated in FIGS. 5–7, bellows 278 is a flexible portion of bellows cylinder 272. Bellows 278 allows relative motion between chamber assembly 100 and ground 82. Bellows 278 also allows compressing bellows cylinder 272 to expose vibration isolation connection assembly 260 therein.

Bellows cylinder 272 has a first end 272A removably connected to connection port 136 on a panel, such as front panel 104, side panel 106, 108 or rear panel 110, of wafer stage chamber assembly 100, and a second end 272B removably connected to stationary surface 82. In the illustrated embodiment, second end 262B of shock absorbing assembly 262 is fastened to second end 272B of bellows cylinder 272 using a plurality of screws (not shown) to secure openings 262C of second end 262B to openings 272C of second end 272B. Bellows cylinder 272 may be constructed of a plurality of tubes telescoping one over another (not shown) to allow retraction and extension of the length of bellows cylinder 272. Bellows cylinder 272 may be made of stainless steel, aluminum, aluminum alloy, or other metal.

As shown in FIG. 5, connection port 136 may include an axial sealing surface 136A and a threaded chamber nut 136B for a mating engagement with bellows assembly 270. Sealing flange 274, provided at first end 272A of bellows cylinder 272, engages with a corresponding sealing surface 136A of panel 104, 106, 108, or 110 to maintain the controlled environment inside wafer stage chamber assembly 100. Sealing flange 274 and sealing surface 136A may be made of the same material as bellows cylinder 272 and be ground to obtain smooth surfaces to prevent leakage into or out of the controlled environment of chamber assembly 100. Additionally, sealing flange 274 may be provided with an annular groove 273 to receive an annular seal 275, such as a commercially available o-ring seal. Sealing flange 274 may alternatively be attached to or an integral part of bellows nut 276.

Bellows nut 276 has an opening diameter slightly larger than the diameter of bellows cylinder 272 so that bellows nut 276 can slide along bellows cylinder 272. An annular face 276A of bellows nut 276 facing panel 104, 106, 108, or 110, may be provided with threads to removably connect with threaded chamber nut 136B of panel 104, 106, 108, or 110. The annular face 276B facing stationary surface 82 may be provided with a plurality of spanner holes 277. Spanner holes 277 may be positioned equiangularly around annular face 276B. A spanner wrench 280, shown in FIG. 10, having a plurality of pins 282, 284 positioned corresponding to the spanner holes 277, may be used to fasten or remove bellows nut 276 from connection port 136. Spanner wrench 280 is provided with a scooping arm 286 having an opening diameter at least slightly larger than the diameter of bellows cylinder 272. Conversely, annular face 276B may have a plurality of spanner pins (not shown) instead of spanner holes 277 to correspond with a spanner wrench (not shown) having a plurality of holes positioned corresponding with the spanner pins. Alternatively, annular face 276B may have a plurality of flats (not shown) on its perimeter for use with a wrench.

Bellows 278 connects bellows cylinder 272 and second end 272B. Bellows 278 is preferably compressible. For example, bellows 278 may be a commercially available accordion type of bellows. Thus, when bellows nut 276 is disconnected from chamber nut 136B, bellows 278 can be compressed, and vibration isolation connection assembly 260 encased within bellows assembly 270 will be exposed.

Further consistent with the principles of the present invention, vibration isolation connection assembly 260 comprises a shock absorbing assembly 262, the shock absorbing nut 266, and wrench nut 268. Shock absorbing assembly 262 functions to dampen the vibration caused by the motion of mover assemblies 216A and 216B. Shock absorbing assembly 262 may be, for example, a commercially available piston-and-chamber damper or other equivalent assembly. Shock absorbing nut 266 is threaded on its internal annular surface to correspond with threads on second end 264B of reaction link 264.

Figure 8:
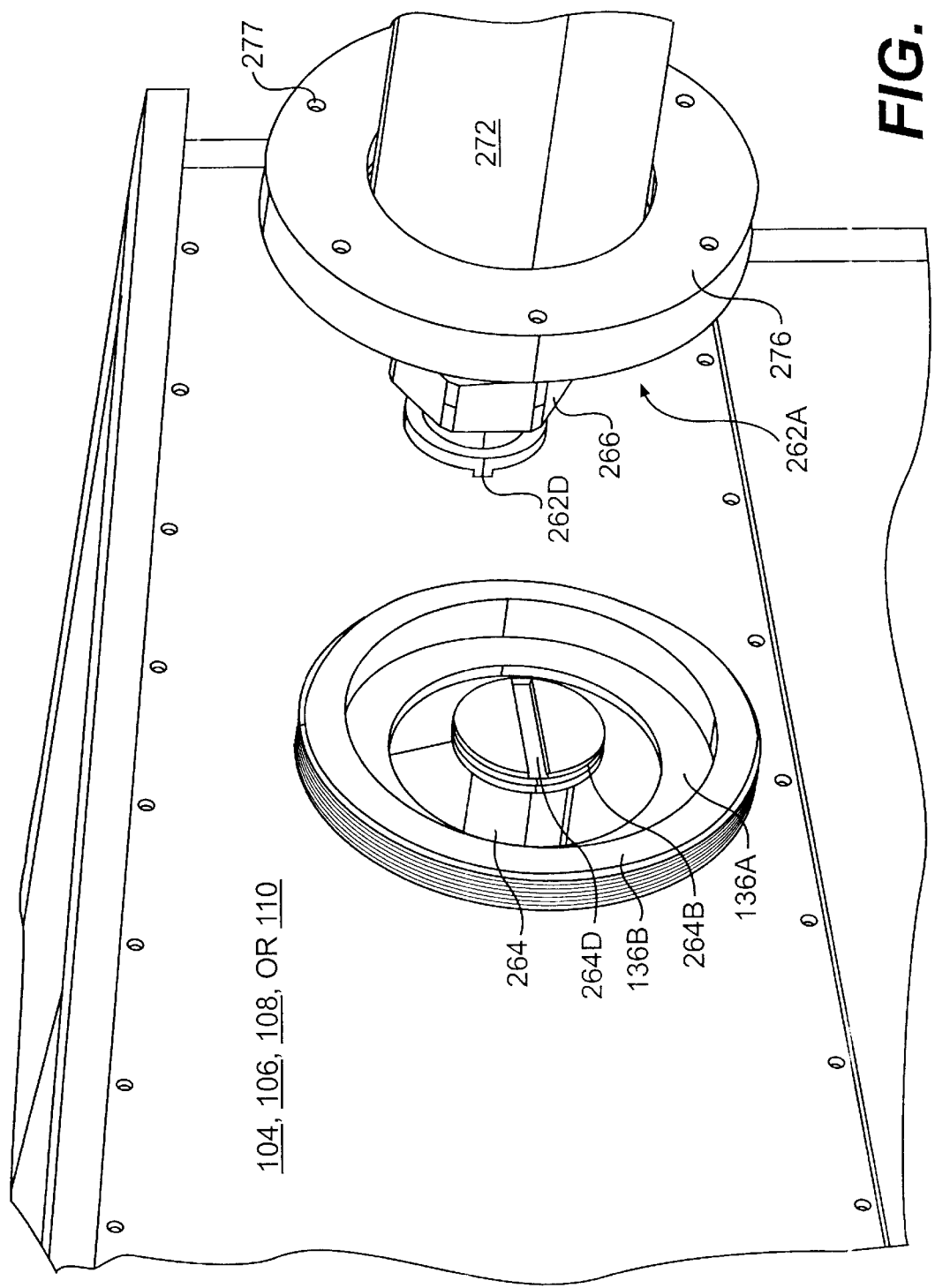
FIGS. 8–11 are fragmentary perspective views of the connection assembly of FIG. 5 being fastened to the reaction link and attached to a panel of the wafer stage chamber assembly.
Figure 9:
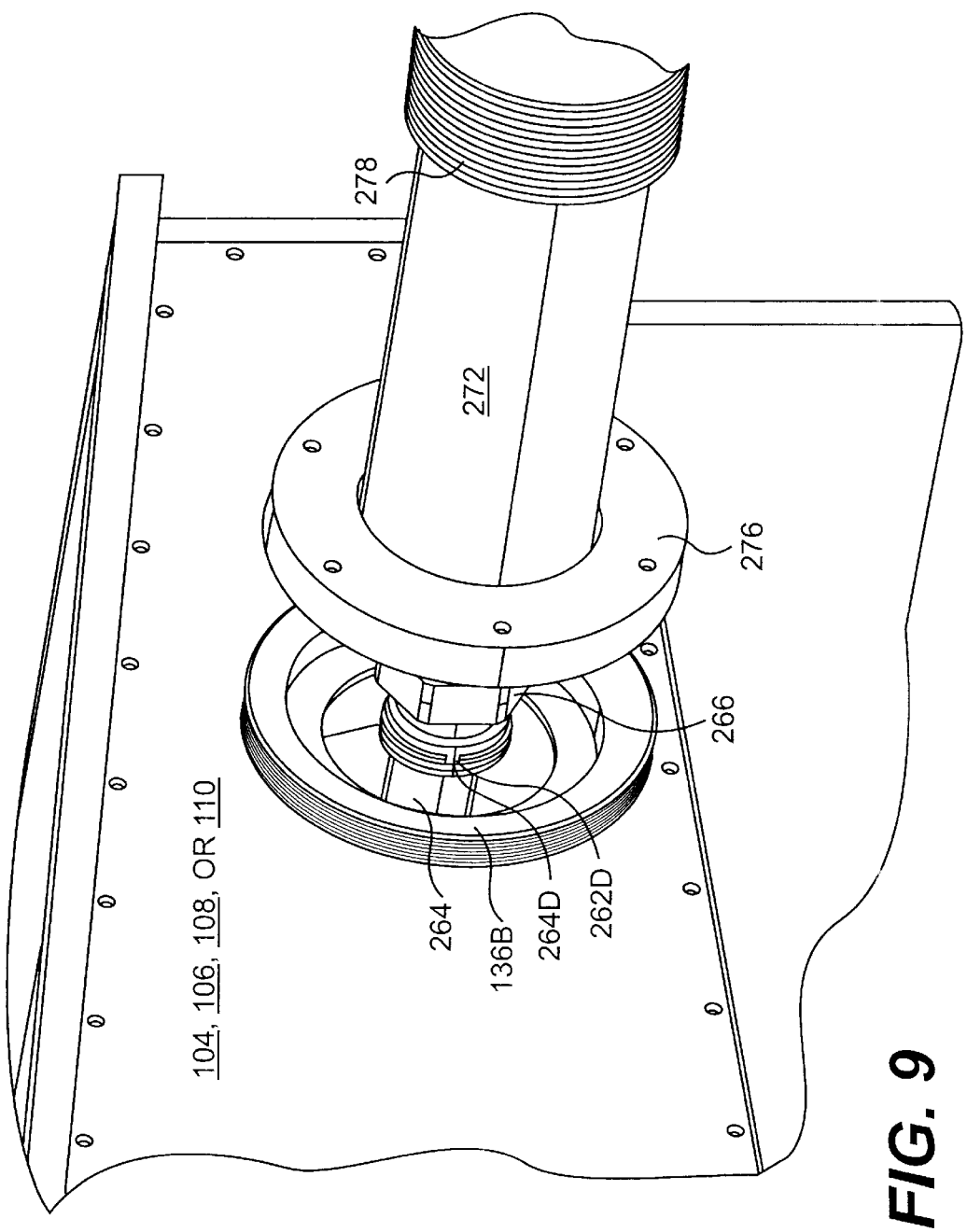
Figure 10:
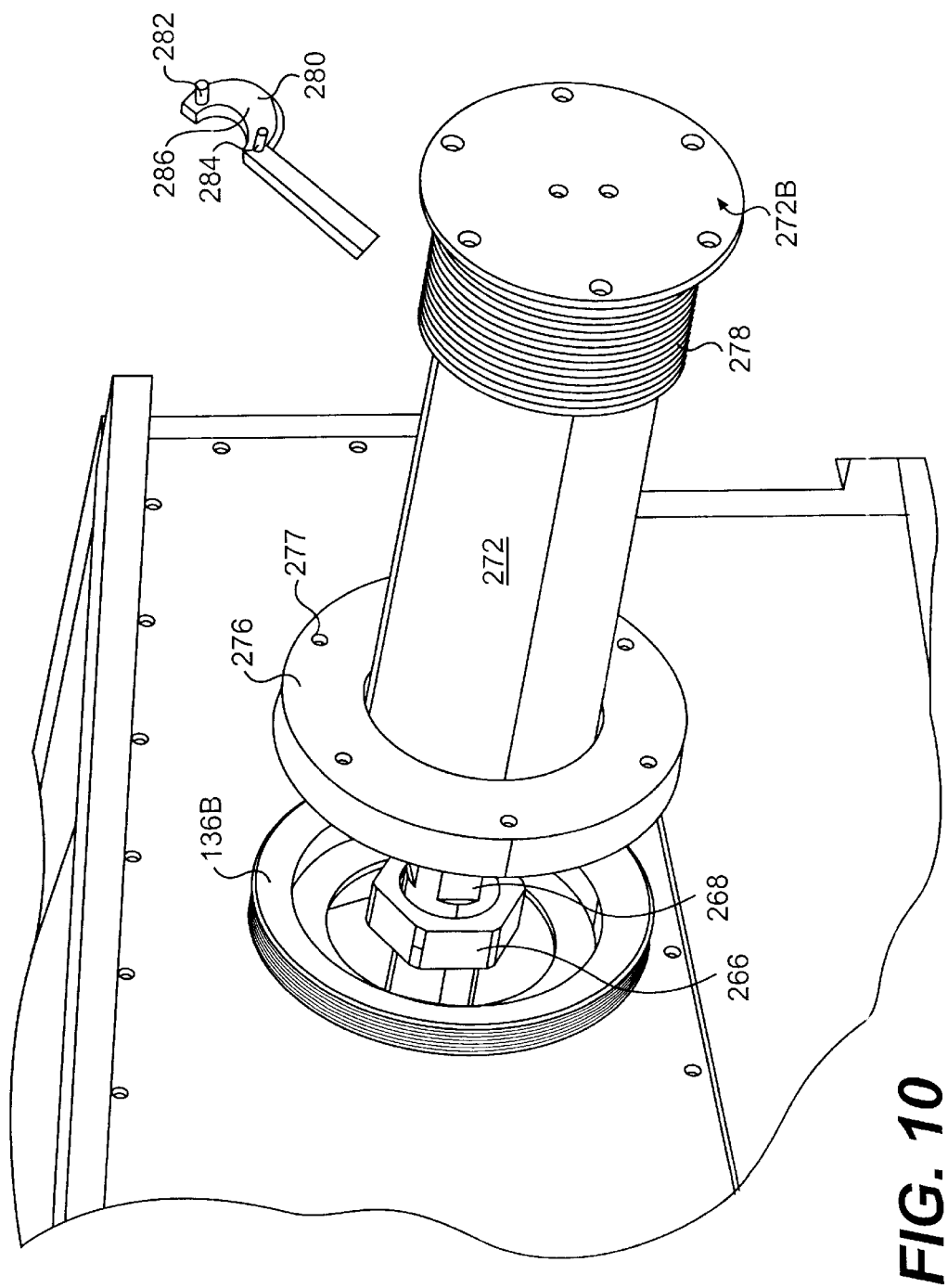
Figure 11:
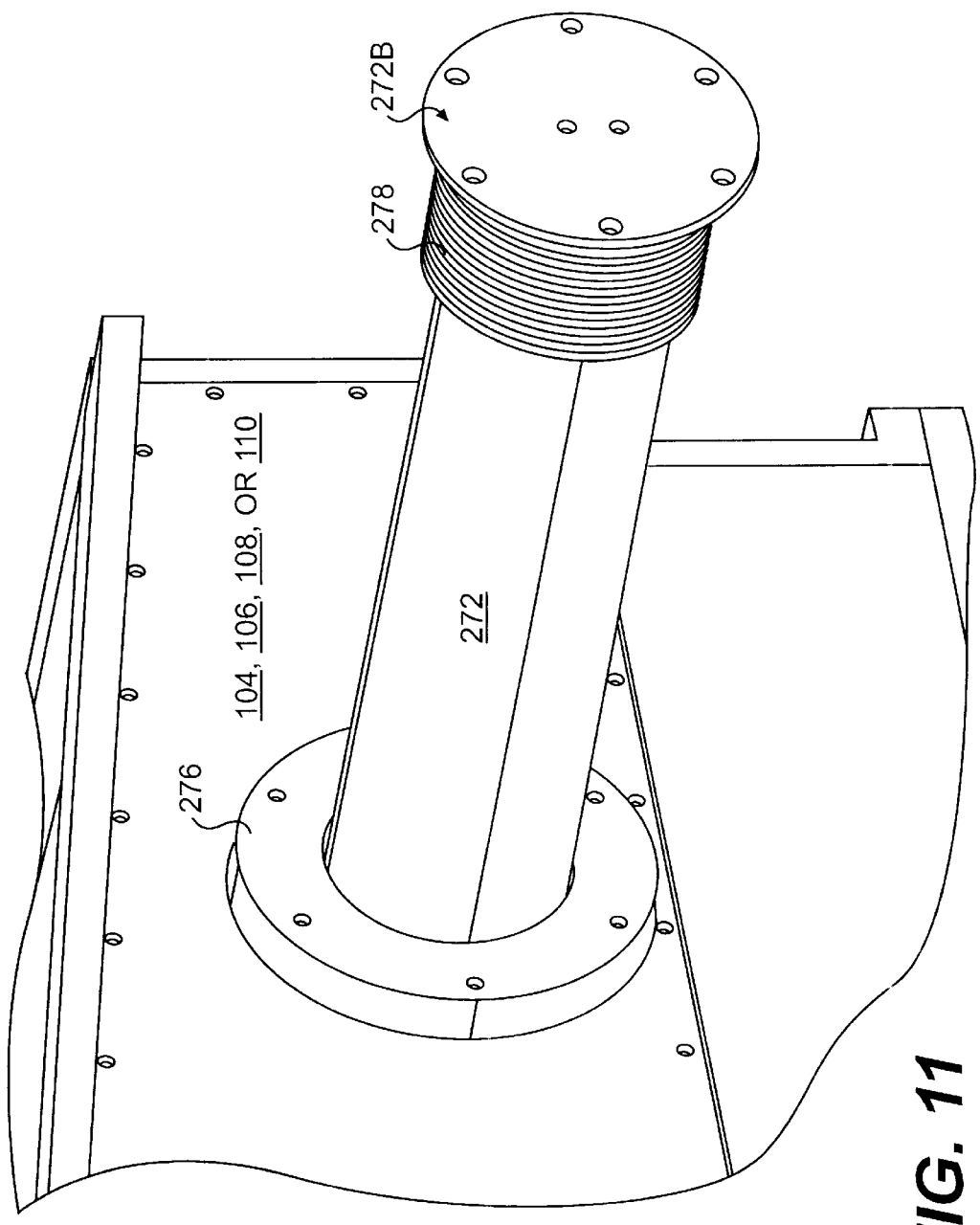

FIGS. 8–11 illustrate the process of fastening connection assembly 220 to panel 104, 106, 108, or 110 of chamber assembly 110. As shown in FIG. 8, the interface between first end 262A of shock absorbing assembly 262 and second end 264B of reaction link 264 may be provided with a tongue-and-groove connection, i.e., a slot 264D for mating engagement with a keyway 262D. FIG. 9 illustrates the mating engagement of keyway 262D and slot 246D before shock absorbing nut 266 is fastened to threads 264B of reaction link 264. Wrench nut 268 is provided so that a wrench (not shown) can be anchored to hold shock absorbing assembly 262 while tightening or loosening shock absorbing nut 266. After the mating engagement of keyway 262D and slot 264D, and fastening shock absorbing nut 266 to threads 264B, FIG. 10 illustrates when bellows assembly 270, encasing vibration isolation connection assembly 260 therein, is going to be secured to panel 104, 106, 108, or 110 of chamber assembly 100 using spanner wrench 280 to fasten bellows nut 276 onto chamber nut 136B. FIG. 11 illustrates connection assembly 220 being fully secured to panel 104, 106, 108, or 110 of chamber assembly 100.

In operation, when wafer stage chamber assembly 100 needs to be removed from exposure apparatus 21, disconnecting wafer stage chamber assembly 100 begins by loosening connection assembly 220. First, each bellows assembly 270 is disconnected from panels 104, 106, 108, and 110 by unthreading bellows nut 276 from chamber nut 136B, using spanner wrench 280, and sliding bellows nut 276 together with sealing flange 274 toward second end 272B of bellows cylinder 272, compressing bellows 278 to expose vibration isolation connection assembly 260. Then, each vibration isolation connection assembly 260 is disconnected from reaction link 264 by unscrewing shock absorbing nut 266 while holding wrench nut 268 and then pulling back shock absorbing nut 266 away from reaction link 264. After all six connection assemblies 220 have been disconnected, wafer stage chamber assembly 100 may be removed from exposure apparatus 21 by loosening the fasteners (not shown) at support mounting surfaces 204A, 206A, and 134C as described in co-pending U.S. application Ser. No. 09/843,076, filed on Apr. 27, 2001, and co-pending U.S. application Ser. No. 09/843,077, filed on Apr. 27, 2001.

Figure 12:
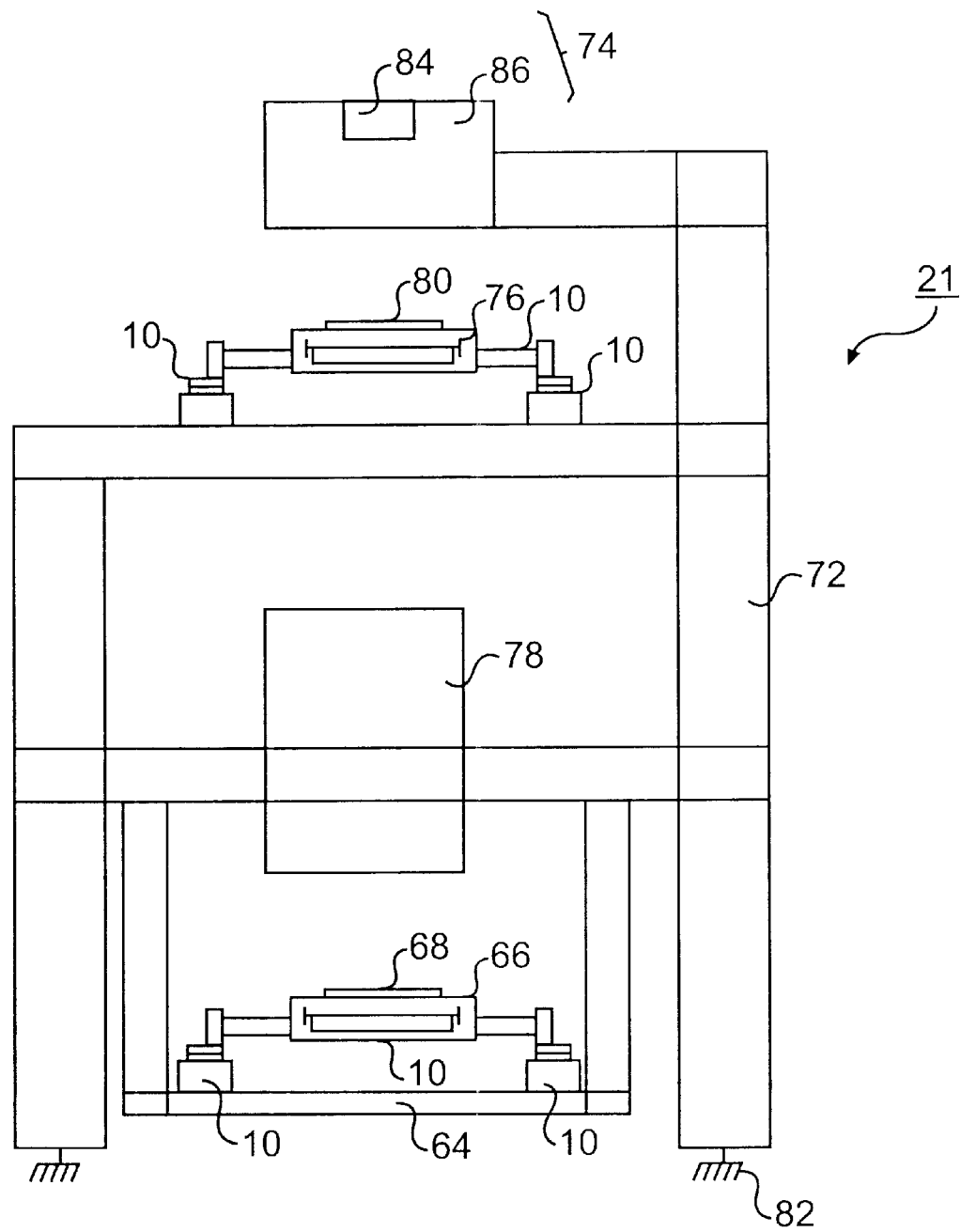
FIG. 12 is a schematic elevation view of an exposure apparatus having a wafer stage assembly without the wafer stage chamber assembly.

FIG. 12 illustrates a wafer stage 66 without the wafer stage chamber assembly attached to exposure apparatus 21 of a photolithography system to manufacture semiconductor wafers 68. Wafer stage 66 positions the semiconductor wafer 68 as wafer stage 66 is being accelerated by a stage force (not shown) generated in response to a wafer manufacturing control system (not shown). The wafer manufacturing control system is the central computerized control system executing the wafer manufacturing process. To permit smaller and more intricate circuit pattern, projection lens assembly 78 must accurately focus the energy beam to align the overlay of circuit patterns of the multi-layered integrated circuit.

An apparatus frame 72 supports projection lens assembly 78. In operation, exposure apparatus 21 transfers a pattern of an integrated circuit from reticle 80 onto semiconductor wafer 68. Exposure apparatus 21 can be mounted to a base 82, i.e., the ground or via a vibration isolation system (not shown). Apparatus frame 72 is rigid and supports the components of exposure apparatus 21, including reticle stage 76, wafer stage 66, lens assembly 78, and illumination system 74.

Illumination system 74 includes an illumination source 84 to emit a beam of light energy. Illumination system 74 also includes an illumination optical assembly 86 to guide the beam of light energy from illumination source 84 to lens assembly 78. The beam selectively illuminates different portions of reticle 80 and exposes wafer 68.

Lens assembly 78 projects and/or focuses the light passing through reticle 80 to wafer 68. Lens assembly 78 may magnify or reduce the image illuminated on reticle 80. Lens assembly 78 may also be a 1x magnification system.

Reticle stage 76 holds and positions reticle 80 relative to lens assembly 78 and wafer 68. Similarly, wafer stage 66 holds and positions wafer 68 with respect to the projected image of the illuminated portions of reticle 80. Wafer stage 66 and reticle stage 76 are moved by a plurality of motors 10.

The use of exposure apparatus 21 provided herein is not limited to a photolithography system for a semiconductor manufacturing. Exposure apparatus 21, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

The illumination source 84 can be g-line (436 nm), i-line (365 nm), KrF excimer laser (248 nm), ArF excimer laser (193 nm) and $F_2$ laser (157 nm). Alternatively, illumination source 84 can also use charged particle beams such as x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

With respect to lens assembly 78, when far ultra-violet rays such as the excimer laser is used, glass materials such as quartz and fluorite that transmit far ultra-violet rays is preferably used. When the $F_2$ type laser or x-ray is used, lens assembly 78 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. patent application Ser. No. 873,606, filed Jun. 12, 1997, also use a reflecting-refracting type of optical system incorporating a concave mirror, etc., but without a beam splitter, and can also be employed with this invention. The disclosures of the abovementioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures of U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be released mechanically to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

This invention is not limited to use for the chamber assembly that isolates the wafer stage device from the atmospheric condition as described in the embodiments. Instead, this invention can also be used to isolate the reticle (mask) stage device 76 from the atmospheric condition. Similarly, this invention can be used to isolate the projection lens assembly 78.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and purity are controlled.

Figure 13:
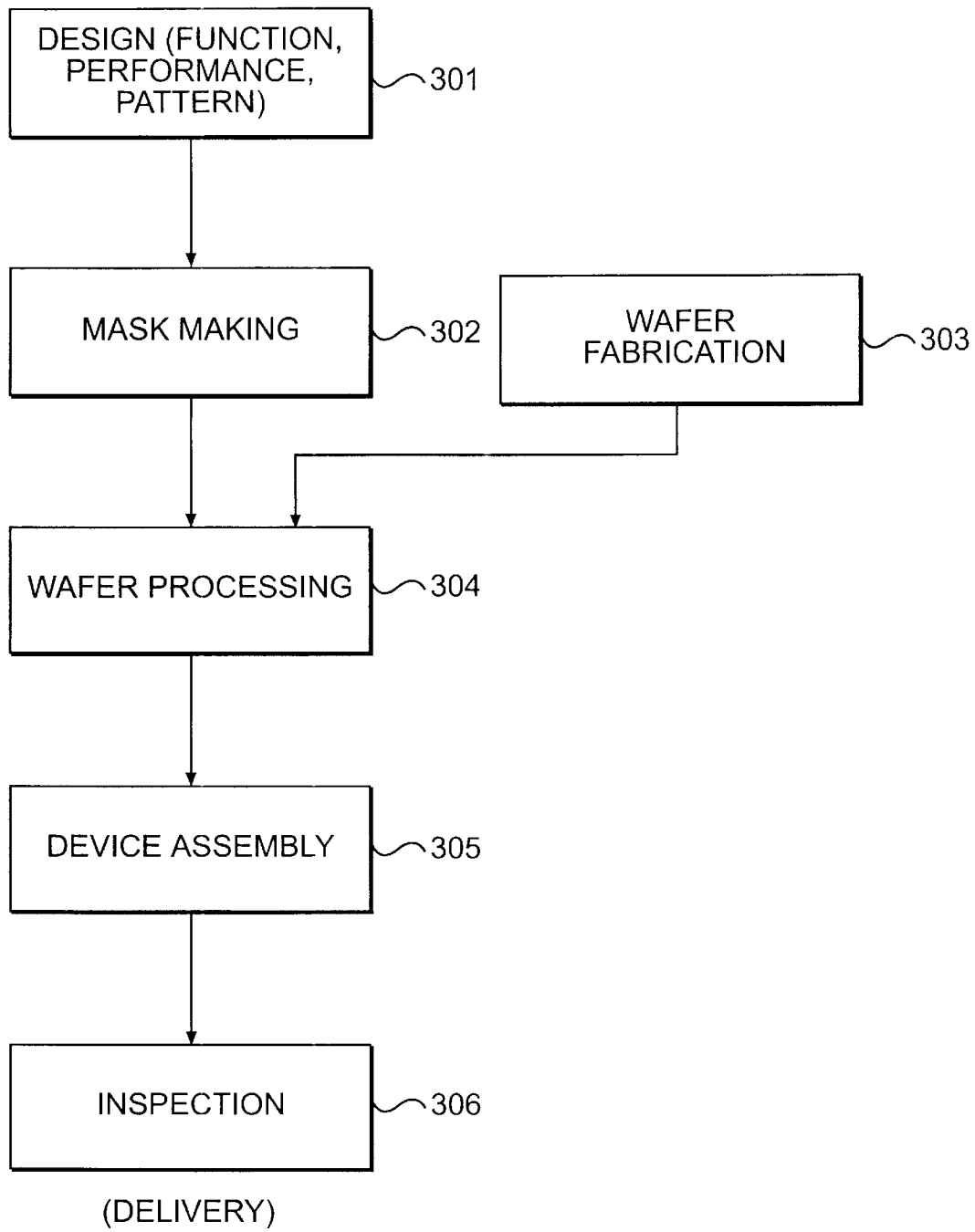
FIG. 13 is a flow chart outlining a process for manufacturing a semiconductor wafer consistent with the principles of the present invention.

Further, semiconductor devices can be fabricated using the above described systems, by the process shown generally in FIG. 13. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system described hereinabove consistent with the principles of the present invention. In step 305 the semiconductor device is assembled (including the dicing process, bonding process and packaging process), then finally the device is inspected in step 306.

Figure 14:
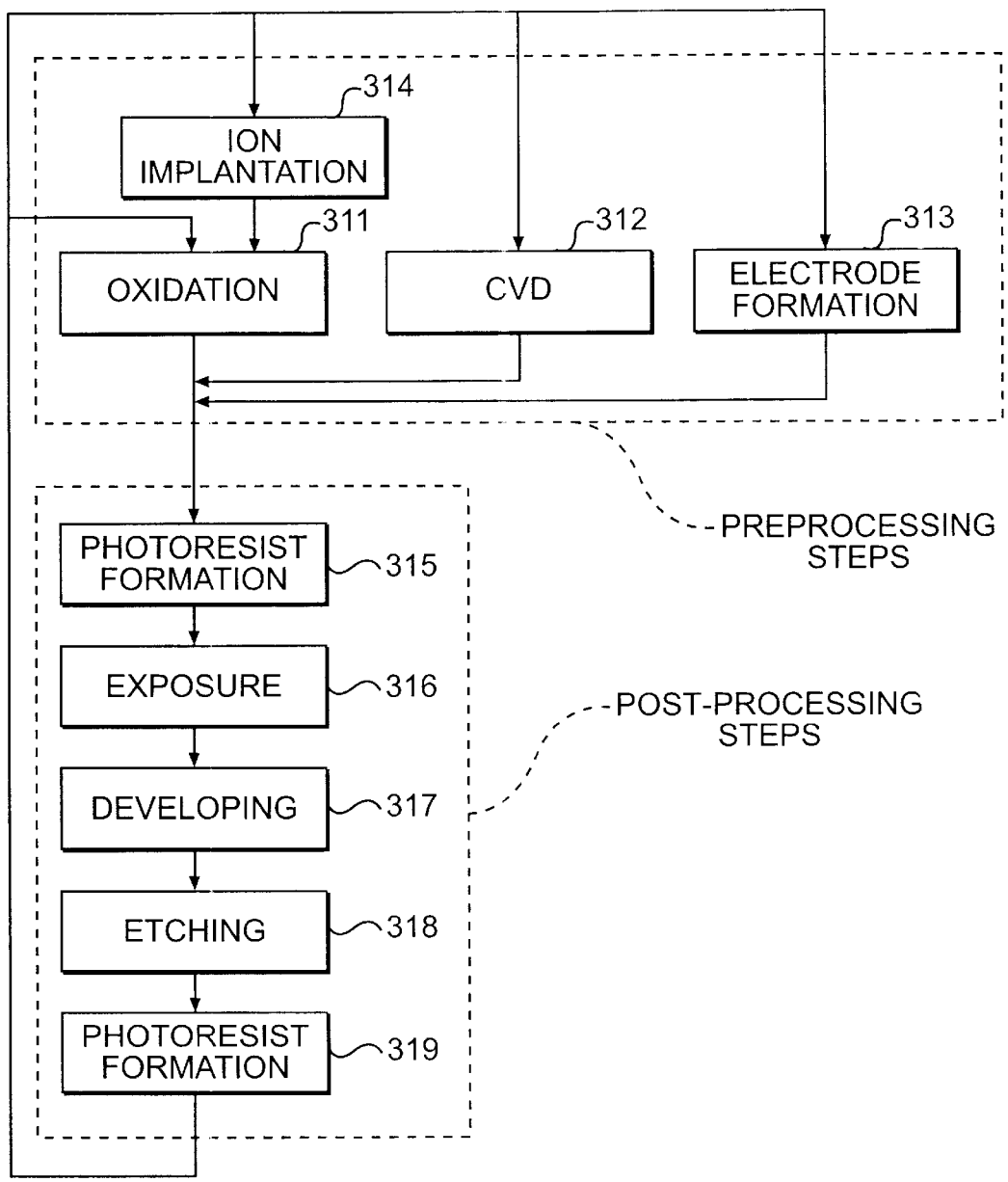
FIG. 14 is a flow chart outlining the semiconductor manufacturing process in further detail.

FIG. 14 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

It will be apparent to those skilled in the art that various modifications and variations can be made in the wafer stage chamber assembly, the components thereof, and the methods described, the material chosen for the present invention, and in construction of the wafer stage chamber assembly, the photolithography systems as well as other aspects of the invention without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

We claim:

1. A connection assembly of a chamber assembly, comprising:
    a vibration isolation connection assembly being removably connected to a part positioned in the chamber assembly via a link; and
    a bellows assembly comprising:
        a bellows cylinder having a bellows;
        a bellows nut configured to slide along the bellows cylinder;
        a first end removably connected to a panel of the chamber assembly; and
        a second end removably connected to a stationary surface,
    wherein the bellows assembly encases the vibration isolation connection assembly to maintain a controlled atmospheric condition of the chamber assembly,
    wherein the bellows assembly is compressible to expose the vibration isolation connection assembly, and
    wherein the bellows nut is removably fastened to a corresponding chamber nut provided on the panel of the chamber assembly.

2. The connection assembly of claim 1, wherein the bellows nut comprises:
    a plurality of spanner holes provided at predetermined positions on an axial face of the bellows nut, the plurality of spanner holes operable by a corresponding spanner wrench to fasten bellows nut to the chamber nut and to remove therefrom.

3. The connection assembly of claim 1, wherein the bellows nut comprises:
    a plurality of spanner pins provided at predetermined positioned on an axial face of the bellows nut, the plurality of spanner pins operable by a corresponding spanner wrench to fasten bellows nut to the chamber nut and to remove therefrom.

4. The connection assembly of claim 1, wherein the bellows assembly further comprises:

a sealing flange adjacent the bellows nut to engage with a corresponding sealing surface on the panel of the chamber assembly.

5. The connection assembly of claim 4, wherein the bellows assembly further comprises:

an o-ring seal sandwiched between the sealing flange and the corresponding sealing surface to maintain the controlled condition of the chamber assembly.

6. The connection assembly of claim 1, wherein the vibration isolation connection assembly comprises:

a shock absorbing assembly having a first end for a first mating engagement with the link and a second end connected to the second end of the bellows assembly.

7. The connection assembly of claim 6, wherein the vibration isolation connection assembly further comprises:

a shock absorbing nut positioned adjacent the first end of the shock absorbing assembly, the shock absorbing nut being removably fastened for a second mating engagement with the link.

8. A chamber assembly comprising the connection assembly of claim 1.

9. A stage assembly comprising the chamber assembly of claim 8.

10. A projection lens assembly comprising the chamber assembly of claim 8.

11. A photolithography system comprising the projection lens assembly of claim 10.

* * * * *

UNITED STATES PATENT AND TRADEMARK OFFICE
CERTIFICATE OF CORRECTION

PATENT NO. : 6,570,644 B2
DATED : May 27, 2003
INVENTOR(S) : Michael Binnard and Michael Kovalerchik It is certified that error appears in the above-identified patent and that said Letters Patent is hereby corrected as shown below:

Column 12,
Line 64, "positioned" should read -- positions --.

Signed and Sealed this

Twenty-second Day of July, 2003

JAMES E. ROGAN
*Director of the United States Patent and Trademark Office*